United States Patent
Schwarzl et al.

(10) Patent No.: US 6,686,643 B2
(45) Date of Patent: Feb. 3, 2004

(54) SUBSTRATE WITH AT LEAST TWO METAL STRUCTURES DEPOSITED THEREON, AND METHOD FOR FABRICATING THE SAME

(75) Inventors: Siegfried Schwarzl, Neubiberg (DE); Werner Pamler, München (DE); Zvonimir Gabric, Zorneding (DE)

(73) Assignee: Infineon Technologies AG, Munich (DE)

( * ) Notice: Subject to any disclaimer, the term of this patent is extended or adjusted under 35 U.S.C. 154(b) by 175 days.

(21) Appl. No.: 09/725,346

(22) Filed: Nov. 29, 2000

(65) Prior Publication Data

US 2001/0002732 A1 Jun. 7, 2001

(30) Foreign Application Priority Data

Nov. 29, 1999 (DE) ......................................... 199 57 302

(51) Int. Cl.⁷ .............................................. H01L 29/00
(52) U.S. Cl. ...................................... 257/522; 257/758
(58) Field of Search ........................ 257/760, 752, 257/753, 758, 762, 763, 522

(56) References Cited

U.S. PATENT DOCUMENTS

| | | | | |
|---|---|---|---|---|
| 5,869,880 A | * | 2/1999 | Grill et al. ................... | 257/522 |
| 5,949,143 A | * | 9/1999 | Bang .......................... | 257/758 |
| 5,994,776 A | * | 11/1999 | Fang et al. .................. | 257/758 |
| 6,211,561 B1 | * | 4/2001 | Zhao .......................... | 257/522 |

2002/0158337 A1 * 10/2002 Babich et al. .............. 257/758

OTHER PUBLICATIONS

Shieh et al. "Air gaps lower k of interconnect dielectics", Solid State Technology (Feb. 1999), p. 51 ff.
Bohr "Interconnect Scaling—The Real Limiter to High Performance ULSI", Portland Technology Development, Intel Corporation, Hillsboro, OR, USA 97124–6497, p. 10.1.1 ff.
Oh et al. "2001 Needs for Multi–Level Interconnect Technology", Circuits & Devices (1995), p. 16 ff.
Ning "0.1μm technology and beol", Mat. Res. Soc. Symp. Proc. vol. 427 (1996 Materials Research Society), IBM Thomas J. Watson Research Center, p. 17 ff.
Yamashita et al. "Interconnect Scalling Scenario using a Chip Level Interconnect Model", Symposium on VLSI Technology Digest of Technical Papers (1997), Semiconductor Research Center, p. 53 ff.

* cited by examiner

*Primary Examiner*—Steven Loke
*Assistant Examiner*—Douglas W. Owens
(74) *Attorney, Agent, or Firm*—Laurence A. Greenberg; Werner H. Stemer; Ralph E. Locher

(57) ABSTRACT

Metal structures that can be produced by a damascene process are disposed in a first insulating layer and a second insulating layer is disposed above the latter. There is in each case at least one cavity which is disposed between the metal structures, is disposed in the first insulating layer and is covered by the second insulating layer. The cavities and the metal structures are produced next to one another by self-aligned process steps.

6 Claims, 2 Drawing Sheets

SUBSTRATE WITH AT LEAST TWO METAL STRUCTURES DEPOSITED THEREON, AND METHOD FOR FABRICATING THE SAME

BACKGROUND OF THE INVENTION

Field of the Invention

The invention relates to a substrate with at least two metal structures deposited thereon.

Integrated circuits are produced with an ever higher packing density. The consequence of this is that interconnects in metalization planes are at an ever smaller distance from one another. This results in an increase in capacitances which are formed by the interconnects and lead to high signal propagation times, a high power loss and crosstalk. The dielectric used between the interconnects has hitherto mainly been $SiO_2$, whose relative permittivity $\epsilon_r=3.9$.

Methods for lowering the relative permittivity and thus for lowering the capacitance between interconnects are described for example in a reference by B. Shieh et al., titled "Air Gaps Lower k Of Interconnect Dielectrics", Solid State Technology (February 1999), 51. A first insulating layer made of $SiO_2$ is produced on a substrate. A metal layer is produced above the insulating layer, and a second insulating layer made of $SiO_2$ is produced above the metal layer. A photolithographic method is carried out to pattern the second insulating layer and the metal layer in such a way that interconnects are produced from the metal layer. In order to produce cavities between the interconnects, $SiO_2$ is deposited selectively on the second insulating layer, with the aid of a chemical vapor deposition (CVD) process, until openings between the interconnects are overgrown. $SiO_2$ is subsequently deposited, with the aid of an HDP-CVD process, in order to prevent the formation of cavities having a very large vertical extent. The cavities adjoin the interconnects, with the result that the dielectric, which determines the capacitance between the interconnects, has a relative permittivity which is almost equal to one. The interconnects are produced by etching the metal layer. However, such a process is disadvantageous particularly when copper is used for the interconnect.

U.S. Pat. No. 5,869,880 shows metalization planes of an integrated semiconductor circuit in which the dielectric between metal structures of a plane has cavities. First, a dielectric is applied on the substrate and the metal structure is disposed in the dielectric. Cavities reaching down to the substrate are then produced in the dielectric. The cavities are subsequently covered with a cover structure.

U.S. Pat. No. 5,949,143 shows a connection structure in which a cavity is formed between adjacent metal lines, the covering layer of which cavity has an indentation in the central region.

SUMMARY OF THE INVENTION

It is accordingly an object of the invention to provide a substrate with at least two metal structures deposited thereon, and a method for fabricating it that overcome the above-mentioned disadvantages of the prior art methods and devices of this general type, which can be produced using a damascene process and form a small capacitance.

With the foregoing and other objects in view there is provided, in accordance with the invention, a semiconductor structure containing a substrate, a first insulating layer deposited on the substrate and having cavities formed therein, and a second insulating layer having an upper horizontal surface, composed of a different material than the first insulating layer, and deposited on the first insulating layer. The cavities formed in the first insulating layer are covered by the second insulating layer and are bounded toward the substrate by part of the first insulating layer. At least two metal structures are deposited spaced apart from one another in the first insulating layer and each have an upper horizontal surface lying level with the upper horizontal surface of the second insulating layer. The cavities are created such that they do not adjoin the metal structures and at least one of the cavities is located between the at least two metal structures.

In a damascening process, depressions are produced for the purpose of producing contacts or interconnects in an insulating layer. Afterwards, metal is deposited and planarized by chemical mechanical polishing, with the result that the contacts and the interconnects are produced in the depressions.

A substrate according to the invention has at least two metal structures disposed on it, a first insulating layer being disposed on the substrate. A second insulating layer, which is composed of a different material than the first insulating layer, is deposited on the first insulating layer. Cavities are disposed in the first insulating layer and are covered by the second insulating layer. The metal structures are spaced apart from one another and each has an upper horizontal surface lying level with an upper horizontal surface of the second insulating layer. The cavities are located in such a way that they do not adjoin the metal structures and that at least one cavity is located between the two metal structures. All horizontal cross sections of the cavity in the region of the first insulating layer are essentially identical.

In a method for producing a substrate with at least two metal structures deposited thereon, the first insulating layer is produced on the substrate. The second insulating layer, which is composed of a different material than the first insulating layer, is produced on the first insulating layer. Cavities are produced in the first insulating layer and are covered by the second insulating layer. The metal structures are produced in such a way that they are spaced apart from one another and each have an upper horizontal surface lying level with an upper horizontal surface of the second insulating layer. The cavities are produced in such a way that they do not adjoin the metal structures and that at least one cavity is located between the two metal structures. The cavity is produced in such way that all horizontal cross sections of the cavity in the region of the first insulating layer are essentially identical.

The horizontal cross sections and the horizontal surfaces run essentially parallel to a surface of the substrate on which the first insulating layer is disposed.

The cavity between the metal structures reduces the capacitance formed by the two metal structures.

Since the cavities lie at a greater depth than the metal structures, it is possible to produce the metal structures by producing depressions in the first insulating layer and filling the depressions by depositing metal and subjecting it to chemical mechanical polishing. It is thus possible to use a damascene process for producing the metal structures.

By way of example, the metal structures are contacts or interconnects of a metalization plane of an integrated circuit.

Since the cavities do not adjoin the metal structures, the metal structures can be produced after the production of the cavities, without the cavities being filled with metal when the metal is deposited.

The provision of the second insulating layer makes it possible to produce the cavity in which all horizontal cross sections in the region of the first insulating layer are essentially identical. Therefore, within the first insulating layer, e.g. the cavities do not narrow at the top, which would lead to a larger capacitance.

By way of example, the cavity is produced by a depression being produced in the first insulating layer and being filled with a filling. The second insulating layer is subsequently deposited. In the second insulating layer, an opening is formed over the filling, through which the filling is removed by isotropic etching. The opening is subsequently closed. A further possibility for producing the cavity consists in producing a depression in the first insulating layer and producing at least part of the second insulating layer by selective deposition, in which no material is deposited on the first insulating layer.

A method is described below in which the cavity is produced by selective deposition and in which the cavities and the metal structures are produced next to one another in a self-aligned manner.

A mask is produced on the first insulating layer, which mask covers at least a first region and, spaced apart from the latter, a second region of the insulating layer. The first insulating layer is etched down to a first depth with the aid of the mask. After the etching down to the first depth, as part of the second insulating layer, spacers are produced with a depth such that at least two of the spacers are disposed between the first region and the second region and are spaced apart from one another. After the production of the spacers, material is deposited as conformly as possible and etched back anisotropically until the mask is uncovered, filling structures thereby being produced. If the distance between the two spacers is greater than twice the thickness of the material deposited for the filling structures, then two spacer-like filling structures are created between the two spacers, and each adjoin one of the two spacers. If the distance between the two spacers is less than twice the thickness of the material deposited for the filling structures, then one filling structure adjoins both spacers.

After the production of the filling structures, as part of the second insulating layer, filling layers are produced by material being deposited and subjected to chemical mechanical polishing until the mask is uncovered. The thickness of the deposited material for the filling layers is preferably greater than the sum of the thickness of the mask and the first depth, so that a planar surface is present after the chemical mechanical polishing.

The filling structures are removed after the production of the filling layers. Those parts of the first insulating layer which are uncovered by the removal of the filling structures are etched down to a second depth, which is below the level of the first depth, first depressions thereby being produced. Material is deposited by a selective deposition process in such a way that the material is deposited onto the spacers but not on the first insulating layer, until cavities covered by the material are produced in the first depressions. After the formation of the cavities, chemical mechanical polishing is effected until the mask is removed, with the result that cover structures are produced from the selectively deposited material as part of the second insulating layer, cover the cavities and are disposed between the spacers.

The first region and the second region, which are uncovered by the removal of the mask, are etched selectively with respect to the cover structures, the filling layers and the first spacers, with the result that second depressions reaching at least down to the second depth are produced. Afterwards, metal is deposited and removed by chemical mechanical polishing until the cover structures are uncovered, metal structures thereby being produced in the second depressions.

The metal structures are thus fabricated by a damascene process.

The cover structures, the spacers and the filling layers form the second insulating layer.

The first depth determines the thickness of the cover structures and is equal to the thickness of the cover structures. The second depth determines a distance between the bottoms of the cavities and a lower horizontal surface of the first insulating layer. The difference between the thickness of the first insulating layer and the second depth is equal to the distance. A width of the cavities may amount to up to twice the thickness of the material deposited for producing the filling structures. The thickness of the material for producing the filling structures is essentially, i.e. given 100% conformal deposition, equal to the width of the cavities for the case where the distance between two of the spacers between which no part of the mask is situated is greater than twice the thickness of the material. The width of a cavity is a dimension that runs in a horizontal plane and runs perpendicularly to a lateral area of one of the metal structures, the lateral area being located beside the cavity.

The second depressions can cut through the first insulating layer.

On account of the self-aligned process steps, the cavities are distributed in such a way that the metal structures laterally adjoin parts of the first insulating layer which have a defined horizontal thickness. This defined horizontal thickness is determined by the thickness of the spacers. The thickness of the spacers is equal to the defined horizontal thickness.

The capacitance formed by the two metal structures is smaller the thinner the spacers and the cover structures and the deeper the second depth.

In order to lower the capacitance, it is advantageous if the distance between the two metal structures is approximately equal to the sum of twice the thickness of the spacers and twice the thickness of the material deposited for producing the filling structures. In this case, a single, particularly wide cavity is created between the metal structures.

As a result of the selective deposition of the material for producing the cover structures, the second insulating layer has indentations disposed above central regions of the cavities.

The filling structures can be etched selectively with respect to the mask, with respect to the filling layers and with respect to the spacers. The first insulating layer can be etched selectively with respect to the mask, with respect to the filling layers, with respect to the spacers and with respect to the cover structures. The mask, the filling layers, the spacers and the cover structures may be composed of the same material.

In order to simplify the process, it is advantageous if the filling structures and the first insulating layer are composed of the same material, since the removal of the filling structures and the production of the second depressions can be carried out in one etching step. By way of example, the filling structures and the first insulating layer are composed of silicon nitride. In that case, the mask, the filling layers, the spacers and the cover structures are preferably composed of $SiO_2$.

If the spacers are composed of $SiO_2$, then the material can be selectively deposited on the spacers by an $O_3$/TEOS- CVD process. The process is preferably carried out at a pressure of between 200 and 700 torr and an ozone concentration of between 10 and 15% by weight.

In the case of a technology generation in which metal structures have a width of x*350 nm, where x is a positive number, the second insulating layer preferably has a thickness of between x*50 nm and x*100 nm, apart from the indentations. Therefore, in the course of etching down to the first depth, etching is effected to a depth of between x*100 nm and x*150 nm.

The spacers and the horizontal thickness—defined thereby—of the parts of the first insulating layer preferably amount to between x*30 nm and x*80 nm.

If the first insulating layer is applied on a material on which material has likewise been deposited during the selective deposition of the material, then it is advantageous if the first depressions do not cut through the first insulating layer. The first depressions are preferably produced in such a way that the second depth lies between x*30 nm and x*80 nm above the lower horizontal surface of the first insulating layer.

The material for producing the filling structures is preferably deposited to a thickness of approximately x*100 nm and x*200 nm.

In order to prevent the diffusion of metal ions, e.g. Cu, into the first insulating layer and/or into the second insulating layer, it is advantageous if a thin layer acting as a diffusion barrier is deposited before the production of the metal structures and after the production of the second depressions. This layer is composed for example of TaN/Ta or a double layer comprising TaN and Ta.

In accordance with an added feature of the invention, the first insulating layer is composed of silicon nitride, and the second insulating layer is composed of $SiO_2$.

In accordance with an additional feature of the invention, the second insulating layer has indentations formed therein located above central regions of the cavities.

In accordance with another feature of the invention, the cavities are distributed such that the metal structures laterally adjoin parts of the first insulating layer, and the parts of the first insulating layer have a defined horizontal thickness.

In accordance with a further feature of the invention, the second insulating layer has a thickness of between 50 nm and 100 nm, apart from the indentations, and the defined horizontal thickness of the parts of the first insulating layer is between 30 nm and 80 nm.

With the foregoing and other objects in view there is provided, in accordance with the invention, a method for producing a semiconductor structure. The method includes the steps of providing a substrate, forming contacts in the substrate, depositing a first insulating layer on the substrate, and etching the first insulating layer in a patterned manner. Spacers and filling structures are formed on etched-free sidewalls of the first insulating layer. The filling structures are etched away and the first insulating layer is further etched for forming cavities. A second insulating layer, composed of a different material than the first insulating layer, is deposited on the first insulating layer. The cavities in the first insulating layer are covered by the second insulating layer in which cover structures are formed from the second insulating layer to cover the cavities. The first insulating layer is etched between the spacers to form depressions that reach down to the contacts located in the substrate. The depressions are formed such that the cavities do not adjoin the depressions and that at least one of the cavities is located between two of the depressions. The depressions are filled with a metal for producing metal structures in the first insulating layer that are spaced apart from one another and each have an upper horizontal surface lying level with an upper horizontal surface of the second insulating layer.

In accordance with an added feature of the invention, there are the steps of:

a) producing a mask on the first insulating layer, the mask covering a first region of the first insulating layer and, spaced apart from the first region, covering a second region of the first insulating layer;

b) etching parts of the first insulating layer down to a first depth with an aid of the mask;

c) after etching down to the first depth, as part of the second insulating layer, producing the spacers with a thickness such that at least two of the spacers are deposited between the first region and the second region and are spaced apart from one another;

d) after producing the spacers, depositing a first material on the first insulating layer and etching back the first material until the mask is uncovered, the filling structures thereby being produced;

e) after producing the filling structures, as part of the second insulating layer, producing filling layers by depositing a second material and subjecting the second material to a chemical mechanical polishing process until the mask is uncovered;

f) removing the filling structures after producing the filling layers;

g) etching down to a second depth those parts of the first insulating layer which are uncovered by the removal of the filling structures, the second depth being deeper than the first depth, resulting in further depressions being produced in the first insulating layer;

h) depositing a third material selectively onto the spacers and not on the first insulating layer, until the further depressions are covered by the third material resulting in the formation of the cavities;

i) after forming the cavities, chemical mechanical polishing is effected until the mask is removed, resulting in the cover structures covering the cavities being produced from the third material which forms part of the second insulating layer;

j) anisotropically etching selectively with respect to the cover structures, the filling layers and the spacers, the first region and the second region which are uncovered on account of the removal of the mask, thereby producing the depressions which reach at least down to the second depth; and k) depositing the metal and removing excess parts of the metal by chemical mechanical polishing until the cover structures are uncovered, with a result that metal structures are produced in the depressions.

In accordance with an additional feature of the invention, there are the steps of producing the first insulating layer and the filling structures from silicon nitride, and producing the cover structures, the spacers and the filling layers from $SiO_2$.

In accordance with another feature of the invention, there are the steps of producing the spacers from $SiO_2$, and using an $O_3$/TEOS-CVD process for selectively depositing the third material on the spacers at a pressure of between 200 torr and 700 torr and an ozone concentration of between 10 and 15% by weight.

In accordance with a concomitant feature of the invention, there are the steps of forming the metal structures with a width of x*350 nm, where x is a positive number; etching is effected to a depth in nm of between x*100 nm and x*150 nm in a course of etching down to the first depth; producing the further depressions such that the second depth lies between x*30 nm and x*80 nm above a lower horizontal surface of the first insulating layer; producing the spacers with a thickness of between x*30 nm and x*80 nm; and depositing the material for producing the filling structures to a thickness of between x*100 nm and x*200 nm.

Other features which are considered as characteristic for the invention are set forth in the appended claims.

Although the invention is illustrated and described herein as embodied in a substrate with at least two metal structures deposited thereon, and a method for fabricating it, it is nevertheless not intended to be limited to the details shown since various modifications and structural changes may be made wherein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
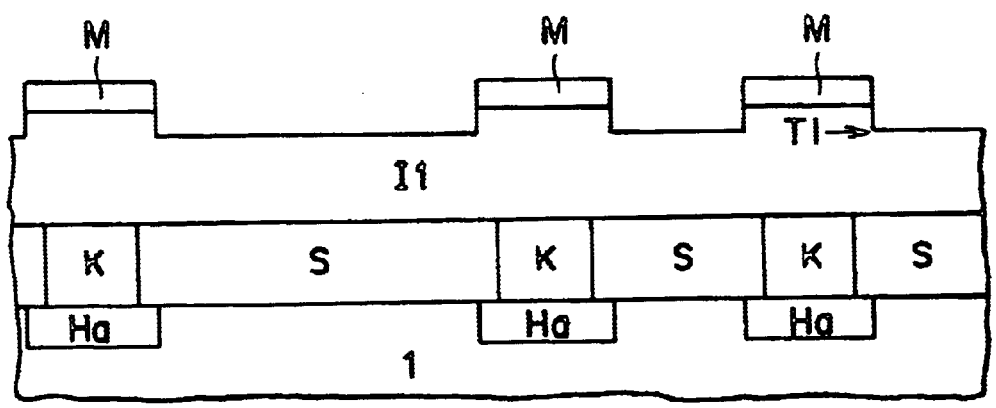
FIG. 1 is a diagrammatic, cross-sectional view through a substrate after semiconductor components, an $SiO_2$ layer, contacts, a first insulating layer and a mask have been produced according to the invention.

In all the figures of the drawing, sub-features and integral parts that correspond to one another bear the same reference symbol in each case. In addition, the figures are not true to scale. Referring now to the figures of the drawing in detail and first, particularly, to FIG. 1 thereof, there is shown an exemplary embodiment formed of a substrate 1 made of silicon, in whose surface semiconductor components Ha of an integrated circuit are disposed, and are illustrated schematically in FIG. 1.

A $SiO_2$ layer S having a thickness of approximately 400 nm is deposited on the substrate 1. In the $SiO_2$ layer S, contact holes are opened to the semiconductor components Ha, and contacts K are produced by tungsten being deposited to a thickness of approximately 200 nm and being removed by chemical mechanical polishing until the $SiO_2$ layer S is uncovered.

In order to produce a first insulating layer I1, silicon nitride is deposited on the $SiO_2$ layer S to a thickness of approximately 600 nm by a plasma CVD process.

In order to produce a mask M, $SiO_2$ is deposited on the first insulating layer I1 to a thickness of approximately 150 nm and is patterned by a photolithographic method. FIG. 1 shows three strip-shaped regions of the first insulating layer I1 which are covered by the mask M. The strip-shaped regions are approximately 350 nm wide. Of the regions, a first and a second region are at a distance of approximately 600 nm from one another. The second region and a third region of the regions are at a distance of approximately 350 nm from one another. In the course of the patterning of the $SiO_2$ for the purpose of producing the mask M, the first insulating layer I1 is also etched down to a first depth T1, which amounts to approximately 150 nm.

Afterwards, $SiO_2$ is deposited to a thickness of approximately 50 nm and anisotropically etched back selectively with respect to silicon nitride until parts of the first insulating layer I1 and the mask M are uncovered. Spacers SP adjoining lateral areas of the mask M are produced as a result of this (see FIG. 2). Two of the spacers SP are disposed between two of the strip-shaped regions in each case.

Figure 2:
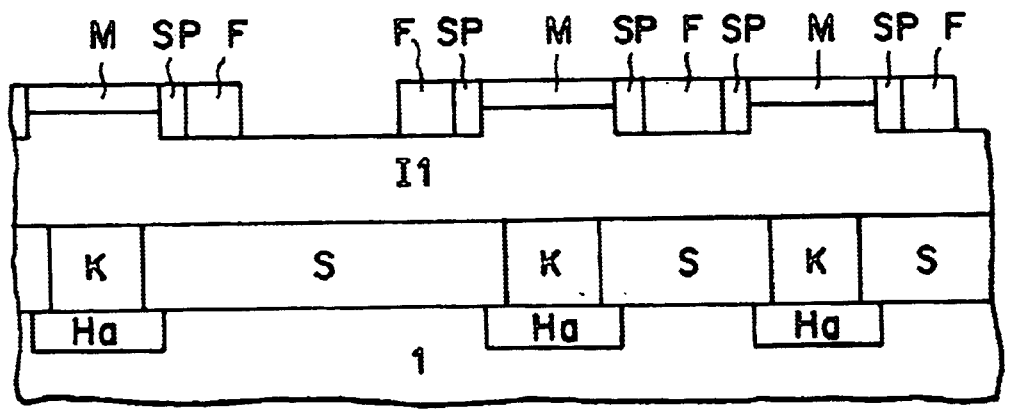
FIG. 2 is a cross-sectional view similar to FIG. 1 after spacers and filling structures have been produced.

In order to produce filling structures F, silicon nitride is deposited to a thickness of approximately 150 nm and anisotropically etched back selectively with respect to $SiO_2$ until the mask M is uncovered. Two spacer-like filling structures of the filling structures F, which adjoin the spacers SP, are thereby formed between the first strip-shaped region and the second strip-shaped region. One of the filling structures F, which adjoins two of the spacers SP, is formed between the second strip-shaped region and the third strip-shaped region (FIG. 2).

Figure 3:
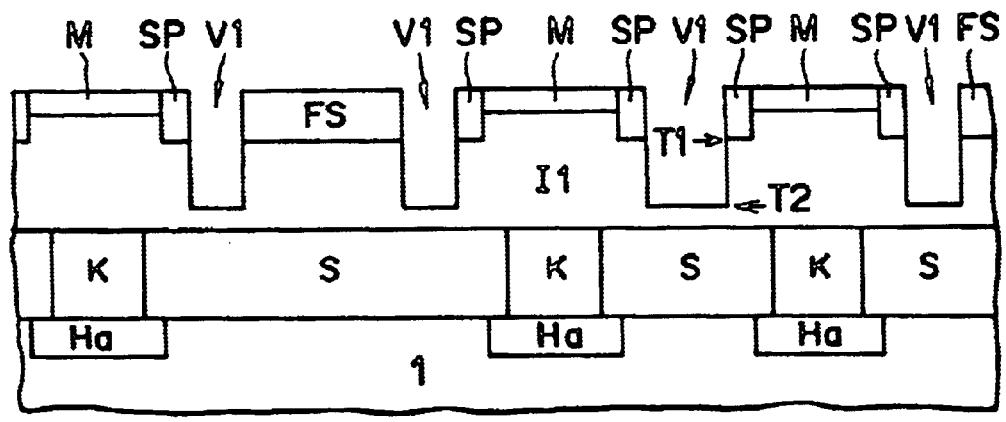
FIG. 3 is a cross-sectional view similar to FIG. 2 after filling layers have been produced, the filling structures have been removed and first depressions have been produced.

In order to produce filling layers FS, $SiO_2$ is deposited to a thickness of approximately 500 nm and removed by chemical mechanical polishing until the filling structures F are uncovered (see FIG. 3). A planar surface is thereby formed. The filling layers FS are disposed between the filling structures F.

Anisotropic etching of silicon nitride selectively with respect to $SiO_2$ using, for example, $SF_6/He$ or $CF_4/O_2/Ar$ is performed to remove the filling structures F and to etch underlying parts of the first insulating layer I1 down to a second depth T2, which lies approximately 50 nm above the $SiO_2$ layer S. First depressions V1 are thereby produced in the first insulating layer I1 (see FIG. 3).

Figure 4:
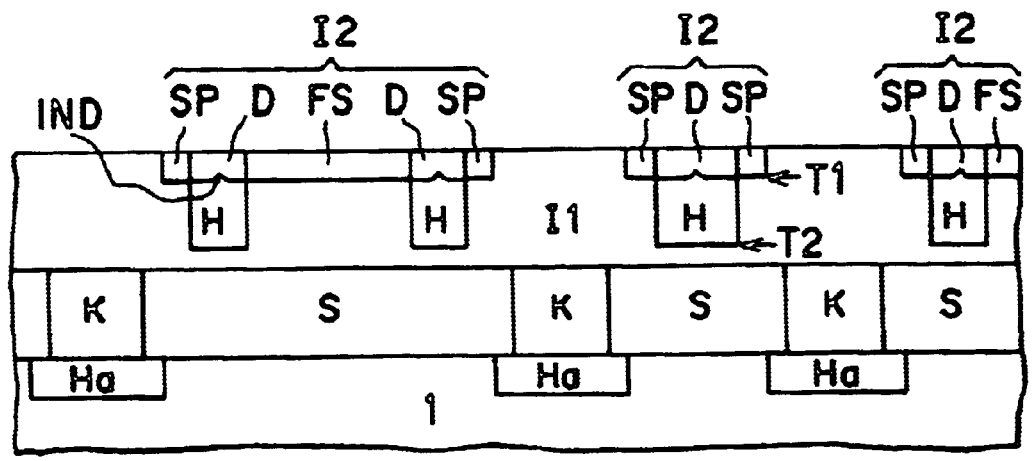
FIG. 4 is a cross-sectional view similar to FIG. 3 after cover structures have been produced and a mask has been removed.

By use of an $O_3$/TEOS-CVD process, $SiO_2$ is deposited selectively on the $SiO_2$ at a pressure of approximately 200 to 700 torr and an ozone concentration of approximately 10 to 15% by weight. In this case, the $SiO_2$ is deposited on the spacers SP, the mask M and the filling layers FS, but not on the first insulating layer I1. The selective deposition of $SiO_2$ is ended when cavities H are formed in the first depressions V1, the cavities being completely covered by the selectively deposited $SiO_2$. Chemical mechanical polishing is subsequently effected until the first insulating layer I1 is uncovered. The mask M is removed in the process. Cover structures D covering the cavities H are formed from the selectively deposited $SiO_2$ as a result of the chemical mechanical polishing (see FIG. 4) and the cover structures D have indentations IND formed therein. The cover structures D, those parts of the spacers SP remaining after the chemical mechanical polishing and those parts of the filling layers FS remaining after the chemical mechanical polishing form a second insulating layer I2.

Figure 5:
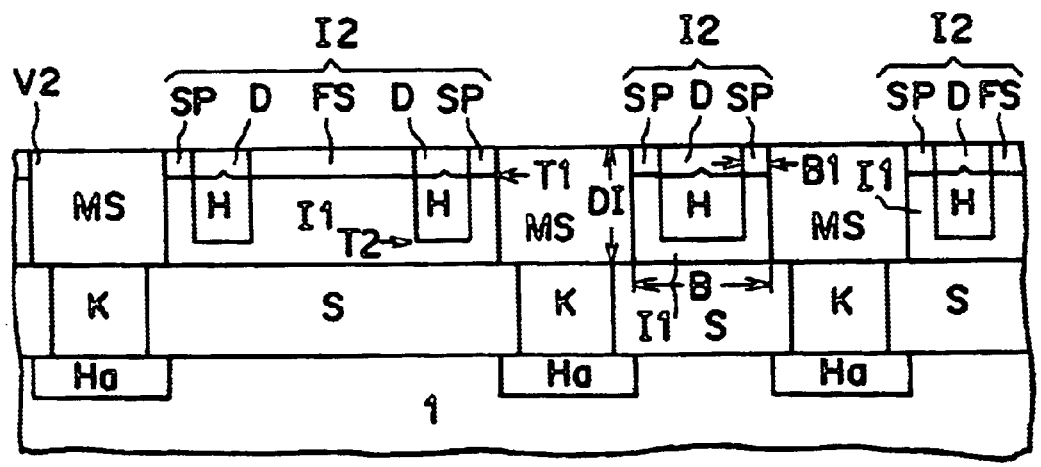
FIG. 5 is a cross-sectional view similar to FIG. 4 after second depressions and metal structures have been produced.

Silicon nitride is etched selectively with respect to $SiO_2$ by an anisotropic etching using, for example, $SF_6/He$ or $CF_4/O_2/Ar$, with the result that second depressions V2 are produced in the strip-shaped regions, the depressions cutting through the first insulating layer I1 (see FIG. 5). The contacts K are uncovered in the process.

In order to produce metal structures MS, copper is deposited to a thickness of approximately 400 nm by sputtering and is planarized by chemical mechanical polishing until the second insulating layer I2 is uncovered. The metal structures MS act as interconnects and are connected to the semiconductor components Ha of the integrated circuit via the contacts K.

The specific capacitance of the cavity H disposed between the metal structure MS that has been produced in the second strip-shaped region and the metal structure MS that has been produced in the third strip-shaped region is calculated below. The specific capacitance is the capacitance referred to a length unit of the metal structures MS.

Figure 6:
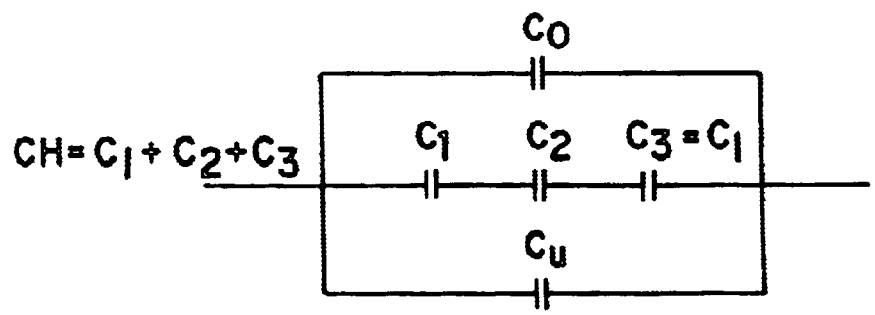
FIG. 6 is an equivalent circuit diagram of the capacitances between two of the metal structures.

FIG. 6 shows the equivalent circuit diagram of the specific capacitance between the two metal structures.

An upper capacitance $C_O$ is formed by parts of the metal structures MS that reach from an upper surface of the metal structures MS down to the first depth T1. Between these parts of the metal structures MS there is essentially $SiO_2$ present, so that $C_O/L=(\epsilon_r \cdot \epsilon_0)$ T1/B where B is a distance between the two metal structures MS, $\epsilon_r$ is the relative permittivity of $SiO_2$, and amounts to 3.9, and L is a length unit.

The middle capacitance $C_H$, which is formed by middle parts of the metal structures MS that reach from the first depth T1 down to the second depth T2, is a series circuit of three capacitances. In the case of a first capacitance $C_1$, the associated relative permittivity $\epsilon_r$ is that of silicon nitride, that is to say is equal to 7.8. $C_1/L=\epsilon_r \times \epsilon_0 \times (T2-T1)/B_1$, where $B_1$ is equal to a horizontal thickness of the spacers SP. A third capacitance $C_3$ has the same value as the first capacitance. A second capacitance $C_2$ is formed by the cavity H. $C_2/L=\epsilon_0 \times (T2-T1)/(B-2 \times B_1)$. The capacitance $C_H$ of the series circuit is thus $C_H/L=\epsilon_0 \times (T2-T1)/(B \times (1+\epsilon_r-1) \times (B-2 \times B_1)/B))$.

A lower capacitance $C_U$, which is formed by parts of the metal structures MS which extend from the $SiO_2$ layer S down to the second depth T2, is determined by silicon nitride. $C_U/L=\epsilon_r \times \epsilon_0 \times (DI-T2)/B$, where DI is the vertical thickness of the metal structures MS.

The total capacitance is the sum of $C_U$, $C_O$ and $C_H$.

There are many conceivable variations of the exemplary embodiment which likewise lie within the scope of the invention. Thus, dimensions of the above-described layers, spacers, contacts, depressions and metal structures can be adapted to the respective requirements. The same applies to the choice of materials.

In order to produce vias or contact pads instead of interconnects, those regions of the first insulating layer I1 which are covered by the mask M may also have a square or round form.

Copper can also be applied by sputtering and electrochemical deposition.

We claim:

1. A semiconductor structure, comprising:
   a substrate;
   a first insulating layer disposed on said substrate and having cavities formed therein, said cavities being separated by said first insulating layer from said substrate and not extending to said substrate;
   a second insulating layer having an upper horizontal surface, composed of a different material than said first insulating layer, and disposed on said first insulating layer, covering said cavities and
   at least two metal structures disposed spaced apart from one another in said first insulating layer and each having an upper horizontal surface lying level with said upper horizontal surface of said second insulating layer, and said cavities not adjoining said metal structures and at least one of said cavities disposed between said at least two metal structures.

2. The semiconductor structure according to claim 1, wherein said first insulating layer is composed of silicon nitride, and said second insulating layer is composed of $SiO_2$.

3. The semiconductor structure according to claim 1, wherein said second insulating layer has indentations formed therein disposed above central regions of said cavities.

4. The semiconductor structure according to claim 1, wherein said cavities are disposed such that said metal structures laterally adjoin parts of said first insulating layer, and said parts of said first insulating layer have a defined horizontal thickness.

5. The semiconductor structure according to claim 4, wherein said second insulating layer has indentations formed therein disposed above central regions of said cavities, said second insulating layer has a thickness of between 50 nm and 100 nm, apart from said indentations, and said defined horizontal thickness of said parts of said first insulating layer is between 30 nm and 80 nm.

6. The semiconductor structure according to claim 1, further comprising a third insulation layer disposed between first insulating layer and said substrate.

* * * * *